United States Patent

[11] 3,588,639

[72] Inventors Gordon R. Fleming
Pontiac;
Stanford R. Ovshinsky, Bloomfield Hills, Mich.

[21] Appl. No. 830,582
[22] Filed May 27, 1969
[45] Patented June 28, 1971
[73] Assignee Energy Conversion Devices, Inc.
Troy, Mich.
Continuation-in-part of application Ser. No. 809,205, Mar. 21, 1969.

[54] CURRENT CONTROLLING DEVICE INCLUDING A VO2 FILM
8 Claims, 9 Drawing Figs.

[52] U.S. Cl. .......... 317/238, 317/235
[51] Int. Cl. .......... H01l 9/00
[50] Field of Search .......... 317/238, 237, 234—235, 21, 21.1

[56] References Cited
UNITED STATES PATENTS

| | | | |
|---|---|---|---|
| 2,371,660 | 3/1945 | Wainer | 317/235 |
| 2,648,805 | 8/1953 | Spenke | 317/235 |
| 2,975,344 | 3/1961 | Wegener | 317/235 |
| 3,258,663 | 6/1966 | Weimer | 317/235 |
| 3,343,004 | 9/1967 | Ovshinsky | 307/88.5 |
| 3,369,159 | 2/1968 | Sihvonen et al. | 317/237X |

*Primary Examiner*—James D. Kallam
*Attorney*—Wallenstein, Spangenberg, Hattis and Strampel ABSTRACT: A current controlling device for an electrical circuit including a semiconductor element and electrodes in low electrical resistance contact therewith, wherein said semiconductor element has a threshold voltage value and a high electrical resistance to provide a blocking condition for substantially blocking current therethrough, wherein the high electrical resistance is substantially instantaneously decreased to a low resistance in response to a voltage above said threshold voltage value to provide a conducting condition for substantially conducting current therethrough, and wherein the semiconductor element between the electrodes comprises a thin substantially amorphous film of substantially $VO_2$ having high electrical resistance.

Inventors
Gordon R. Fleming
Stanford R. Ovshinsky
By: Wallenstein, Spangenberg, Hattis & Strampel Attys.

CURRENT CONTROLLING DEVICE INCLUDING A VO2 FILM

This application is a continuation-in-part of Gordon R. Fleming and Stanford R. Ovshinsky application Ser. No. 809,205,filed March 21, 1969.

The invention of this application is related to and is an improvement upon the invention disclosed in Stanford R. Ovshinsky U.S. Pat. No. 3,271,591issued Sept. 6, 1966. That patent discloses two basic types of current controlling devices, a nonmemory-type device (referred to therein as a "-Mechanism" device) and a memory-type device (referred to therein as "Hi-Lo" and "Circuit Breaker" devices). Both the nonmemory- and memory-type devices are changed from their blocking condition to their conducting condition by applying a voltage above a voltage threshold value. The nonmenory device requires a holding current to maintain it in its conducting condition and it immediately returns to its blocking condition when the current decreases below a minimum current holding value. The memory-type device requires no holding current, it remaining in its conducting condition even though the current is removed or reversed, and it is returned to its blocking condition by a current pulse of at least a threshold current value. The nonmemory-type herein is applicable to both types of current controlling devices.

A principal object of this invention is to provide an improved current controlling device for accomplishing the current controlling or switching functions substantially as performed by the current controlling devices of the aforementioned U.S. Pat. No. 3,271,591.

Another principal object of this invention is to provide improved methods for making the semiconductor elements of the current controlling devices.

The current controlling devices of this invention, while utilizing substantially $VO_2$ in the semiconductor element thereof, are considerably different in construction, manner of operation and results obtained from the Neel effect switching devices of Handelman U.S. Pat. No. 3,149,298 wherein the devices of said patent utilize pure single crystals of various described vanadium-oxygen compounds, which are thermally biased close to selected temperatures for the various selected crystals, which are thermally cycled above and below said selected temperatures for switching purposes, and which have relatively small conductivity differences between their switched conditions.

Briefly, the semiconductor elements of the current controlling devices of this invention which are contacted by the electrodes comprise a thin substantially amorphous film of substantially $VO_2$ having high electrical resistance. The semiconductor elements may be formed by depositing substantially $VO_2$on a substrate at a temperature below about 65° C. to provide said thin substantially amorphous film. For example, the deposition of the substantially amorphous film may be accomplished by vacuum deposition, sputtering or the like from a source of substantially $VO_2$which may be in crystalline or polycrystalline or ingot form, or the like. This high resistance substantially amorphous film which is so deposited on a substrate at a temperature below about 65° C. remains high resistance and substantially amorphous even though heated up to about 700° or so and cooled, there being no sudden change in resistance in the substantially amorphous film during such temperature cycling as is found in the single crystal devices of the aforesaid Handelman patent.

Because of the thin substantially amorphous film of substantially $VO_2$ the semiconductor element has a high electrical resistance in its blocking condition which is much higher than where single crystal $VO_2$ itself would be interposed between the electrodes. In the thin substantially amorphous film there are no special requirements for purity and stoichiometry as would be required in single crystals. The current controlling devices of this invention operate at room temperature and no thermal biasing is necessary. There is no problem with structural degeneration as is experienced in cycling single crystals. Resistivity changes between the blocking condition and the conducting condition are much larger than those in single crystals. Field induced electronic excitation without concomitant temperature increase sufficient to reach a transition point is also possible to obtain switching of the devices of this invention.

The thin substantially amorphous film of substantially $VO_2$ deposited in the above manner is a substantially disordered and generally amorphous structure and it can be truly amorphous or it can contain small crystallites of substantially $VO_2$. It has local order and/or localized bonding for the atoms and a high density of local states in the forbidden band which provide high resistance and a high breakdown voltage. When the thin substantially amorphous film is subjected to a high breakdown voltage, a path is created therethrough which is nonreversible, which has a lower resistance but which is still high, and which has a threshold voltage value which is somewhat lower than the aforementioned breakdown voltage value. In the formation of this path, there can be changes in the local order and/or localized bonding which constitute changes in atomic structure, i.e. structural change, which can be of a suitable nature or more pronounced. Such a structural change in the path provides a more ordered structure, as for example, toward a more ordered crystallinelike condition, and can be substantially within a short range order itself still involving a substantially disordered and generally amorphous structure.

A current controlling device having a thin substantially amorphous film of substantially amorphous $VO_2$, which has been broken down to provide the path therethrough as aforesaid and which forms a switching path, provides a nonmemory-type device which switches from its blocking condition to its conducting condition by applying a voltage of a threshold value thereto and which switches from its conducting condition to its blocking condition when the current therethrough decreases below a minimum current holding value. In this switching between the blocking and conducting condition in this nonmemory-type device it is possible that there is no significant change in the structural state of the substantially $VO_2$ in the switching path.

It has been found that when the thin substantially amorphous film of substantially $VO_2$ also includes a minor amount of $TiO_2$(within the range of 5 to 15 molar percent, preferably about 10 molar percent), the current controlling device becomes a memory-type device as distinguished from a nonmemory device. Here, also, the film is substantially disordered and generally amorphous and of high resistance, and when subjected to a high breakdown voltage, a path is created therethrough which is nonreversible, which has a lower resistance but which is still high, and which as a threshold voltage value which is somewhat lower than the aforementioned breakdown voltage value, all as expressed above in connection with the nonmemory device and with substantially the same structural states and changes therein.

However, when the memory device is subjected to a voltage above a threshold voltage value to switch the path therethrough from the blocking condition to the conducting condition, a further alteration or change in structure takes place in the path and this alteration or change in structure is frozen in so that the path remains in the low resistance conducting condition even though the current through the path decreases to zero or reversed. This structural alteration or change can be in a more ordered direction and toward a crystallinelike condition having a rutilelike structure afforded by the $Ti0_2$ in the film. The memory device can be switched back from its conducting condition to its blocking condition by a high current pulse and, in this respect, the structure in the path is realtered to its former condition, the alterations and realterations being completely reversible.

When breakdown voltage is applied to the nonmemory-type device and interrupted, the switching path assumes the high resistance condition. However, when the breakdown voltage is applied to the memory-type device and interrupted, the switching path most often assumes the low resistance condition but it may be readily altered to the high resistance condition by the application of a current pulse.

Both the nonmemory and memory devices are symmetrical in operation, they blocking and conducting current substantially equally in each direction.

Other objects and advantages of this invention will become apparent to those skilled in the art upon reference to the accompanying specification, claims and drawing in which:

Figure 8:
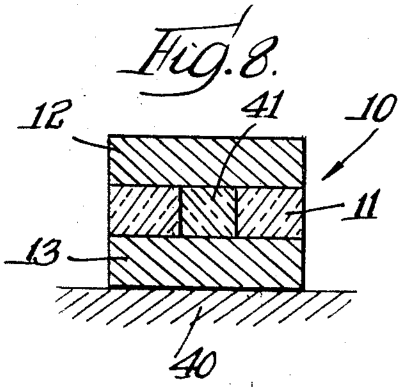
Figure 9:
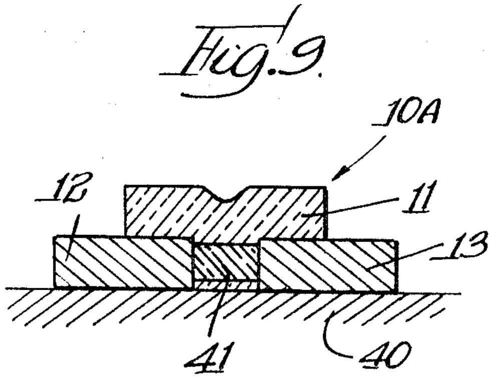

FIG. 8 is an enlarged diagrammatic view of one form of the current controlling device illustrating the thin substantially amorphous film sandwiched between a pair of electrodes and with the switching path formed therethrough by the initial high breakdown voltage; and FIG. 9 is an enlarged diagrammatic view of another form of the current controlling device illustrating a coplanar structure having the thin substantially amorphous film arranged between the ends of a pair of electrodes and with the switching path formed therethrough by the initial high breakdown voltage.

Referring first to FIGS. 8 and 9, two forms of this invention are generally designated at 10 and 10A, respectively. They include a semiconductor material 11, such as described above, arranged between a pair of electrodes 12 and 13. The semiconductor material 11 is of one conductivity type and is of high electrical resistance and the pair of electrodes 12 and 13 in contact with the semiconductor material has a low electrical resistance of transition therewith.

In the form of the invention illustrated in FIG. 8, the electrode 13 may be suitably deposited on a substrate 40, as by vacuum deposition, sputtering or the like, and then the semiconductor material 11 of substantially $VO_2$ is suitably deposited on the electrode 13 as by vacuum deposition, sputtering or the like, the electrode 13 forming a substrate for the semiconductor material, and since the deposition on such substrate is at a temperature below about 65° C., the thin deposited film is substantially amorphous and of high resistance as expressed above. Thereafter, the electrode 12 may be suitably deposited on the thin substantially amorphous film 11 of substantially $VO_2$. Thus, the thin substantially amorphous film 11 of substantially $VO_2$ is sandwiched between the electrodes 12 and 13 in the form of the invention diagrammatically illustrated in FIG. 8.

In the form of the invention diagrammatically illustrated in FIG. 9, the electrodes 12 and 13 are both suitably deposited in closely spaced apart relation on the substrate 40, by vacuum deposition, sputtering or the like, and then the thin substantially amorphous film 11 of substantially $VO_2$ is suitably deposited, as by vacuum deposition, sputtering or the like, over the electrodes 12 and 13 and between the same, the electrodes 12 and 13 and the substrate 40 forming the substrate for such deposition, and since the deposition on such substrate is at a temperature below about 65° C., the film of substantially $VO_2$ is substantially amorphous and of high electrical resistance. Both physical forms of the invention accomplish substantially the same results and other physical forms of the invention may become apparent to those skilled in the art upon reference to these physical forms of the invention.

The thin substantially amorphous film 11 of FIG. 8 may have a thickness from about 50 microns to a fraction of a micron and the spacing between the electrodes 12 and 13 of FIG. 9, having the substantially amorphous film 11 therebetween may be about 50 microns to a fraction of a micron. For a given configuration the electrical resistance of the substantially amorphous film of substantially $VO_2$ can be far in excess 1 megohm and can have an electrical breakdown voltage of about 40 volts. When a breakdown voltage, as for example, about 40 volts, is applied to the electrodes a switching path 41 is established through the thin substantially amorphous film of $VO_2$ which remains permanently, and this switching path, for the same configuration, may have an electrical resistance of about 1 megohm and a threshold voltage value of about 20 volts. When the device is so performed to provide the switching path 41, it will operate as a nonmemory device, and if the substantially amorphous film of substantially $VO_2$ contains a minor amount of $Ti0_2$, it will operate as a memory device, all as expressed above.

The electrodes 12 and 13 should be good electrical conductors and should not react unfavorably with the semiconductor material. As for example, the electrodes may comprise refractory metals, such as, tungsten, tantalum, molybdenum, columbian or the like, or metals such as stainless steel, nickel, chromium or the like.

Figure 1:
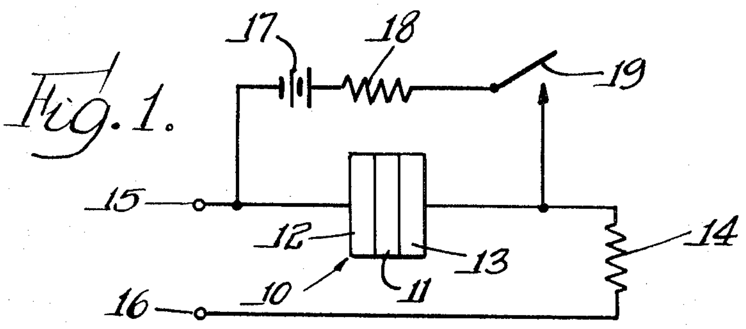
FIG. 1 is a diagrammatic illustration of the current controlling device of this invention connected in series in a load circuit.

Referring now to the diagrammatic illustration of FIG. 1, the current controlling device 10 of this invention having the semiconductor material 11 and the electrodes 12 and 13 is connected in series in an electrical load circuit having a load 14 and a pair of terminals 15 and 16 for applying power thereto. The power supplied may be a DC voltage or an AC voltage as desired. The circuit arrangement illustrated in FIG. 1, and as so far described, is applicable for the nonmemory type of current controlling device. If a memory type of current controlling device is utilized, the circuit also includes a source of current 17, a low resistance 18 and a switch 19 connected to the electrodes 12 and 13 of the current controlling device. The purpose of this auxiliary circuit is to switch the memory-type device from its conducting condition to its blocking condition. The resistance value of the resistance 18 is considerably less than the resistance value of the load 14.

Figure 2:
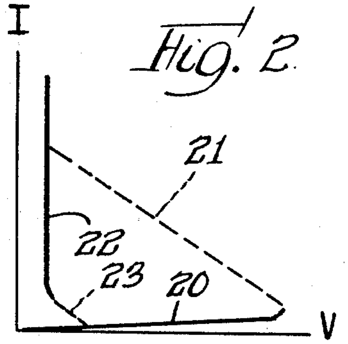
FIG. 2 is a voltage current curve illustrating the operation of the nonmemory-type current controlling device of this invention in a DC load circuit.

FIG. 2 is an I-V curve illustrating the DC operation of the nonmemory-type current controlling device 10 and in this instance the switch 19 always remains open. The device 10 is normally in its high resistance blocking condition and as the DC voltage is applied to the terminals 15 and 16 and increased, the voltage current characteristics of the device are illustrated by the curve 20, the electrical resistance of the path 41 of the device being high and substantially blocking the current flow therethrough. When the voltage is increased to a threshold voltage value, the high electrical resistance in the switching path 41 in the semiconductor material substantially instantaneously decreases between the electrodes 12 and 13 to a low electrical resistance, the substantially instantaneous switching being indicated by the curve 21. This provides a low electrical resistance or conducting condition for conducting current therethrough. The low electrical resistance is many orders of magnitude less than the high electrical resistance. The conducting condition is illustrated by the curve 22 and it is noted that there is a substantially linear voltage current characteristic and a substantially constant voltage characteristic which are the same for increase and decrease in current. In other words, current is conducted at a substantially constant voltage. In the low resistance current conducting condition the semiconductor element has a voltage drop which is a minor fraction of the voltage drop in the high resistance blocking condition near the threshold voltage value.

As the voltage is decreased, the current decreases along the curve 22 and when the current decreases below a minimum current holding value, the low electrical resistance of said path 41 immediately returns to the high electrical resistance as illustrated by the curve 23 to reestablish the high resistance blocking condition. In other words, a current is required to maintain the nonmemory-type current controlling device in its conducting condition and when the current falls below a minimum current holding value, the low electrical resistance immediately returns to the high electrical resistance.

Figure 3:
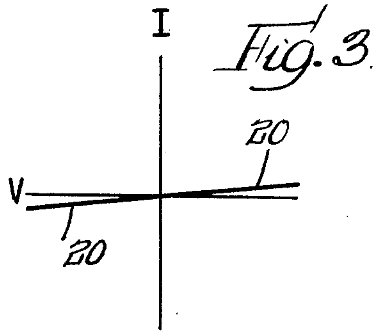
FIGS. 3 and 4 are voltage current curves illustrating the symmetrical operation of the nonmemory-type current controlling device and the operation thereof when included in an AC load circuit.
Figure 4:
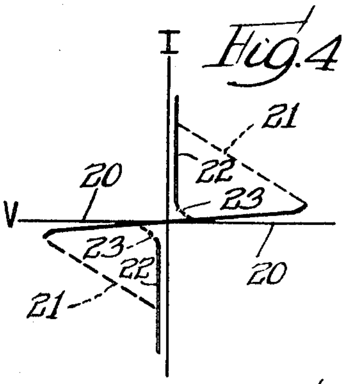

The nonmemory current controlling device 10 of this invention is symmetrical in its operation, it blocking current substantially equally in each direction and it conducting current substantially equally in each direction, and the switching between the blocking and conducting conditions being extremely rapid. In the case of AC operation, the voltage current characteristics for the second half-cycle of the AC current would be in the opposite quadrant from that illustrated in FIG. 2. The AC operation of the device is illustrated in FIGS. 3 and 4. FIG. 3 illustrates the device 10 in its blocking condition where the peak voltage of the AC voltage is below the threshold voltage value of the device, the blocking condition being illustrated by the curve 20 in both half-cycles. When, however, the peak voltage of the applied AC voltage increases above the threshold voltage value of the device, the device is substantially instantaneously switched along the curves 21 to the conducting condition illustrated by the curves 22, the device switching during each half-cycle of the applied AC voltage. As the applied AC voltage nears zero so that the current through the device falls below the minimum current holding value, the device switches along the curve 23 from the low electrical resistance condition to the high electrical resistance condition illustrated by the curve 20, this switching occurring near the end of each half cycle.

For a given configuration of the nonmemory device 10, the high electrical resistance of the path 41 may be about 1 megohm and the low electrical resistance about 10 ohms, the threshold voltage value may be about 20 volts and the voltage drop across the device in the conducting condition may be less than 1 volt, and the switching times may be in nanoseconds or less.

Figure 5:
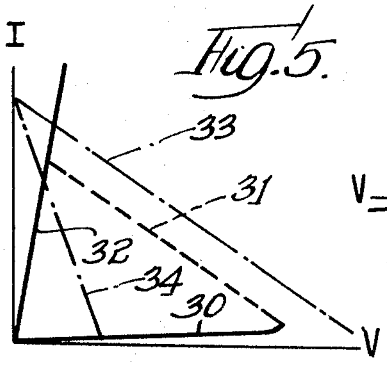
FIG. 5 is a voltage current curve illustrating the operation of the memory-type current controlling device of this invention in a DC load circuit.

FIG. 5 is an I-V curve illustrating the DC operation of the memory type current controlling device 10. The device is normally in its high resistance condition and as the DC voltage is applied to the terminals 15 and 16 and increased, the voltage current characteristics of the device are illustrated by the curve 30, the electrical resistance of the device being high and substantially blocking the current flow therethrough. When the voltage is increased to a threshold voltage value, the high electrical resistance in the switching path 41 in the semiconductor element 11 substantially instantaneously decreases between the electrodes 12 and 13 to a low electrical resistance, the substantially instantaneous switching being indicated by the curve 31. The low electrical resistance is many orders of magnitude less than the high electrical resistance. The conducting condition is illustrated by the curve 32 and it is noted that there is a substantially ohmic voltage current characteristic. In other words, current is conducted substantially ohmically as illustrated by the curve 32. In the low resistance current conducting condition the semiconductor material has a voltage drop which is a minor fraction of the voltage drop in the high resistance blocking condition near the threshold voltage value.

As the voltage is decreased, the current decreases along the curve 32 and due to the ohmic relation the current decreases to zero as the voltage decreases to zero. The memory type current controlling device has memory of its conducting condition and will remain in this conducting condition even though the current is decreased to zero or revised until switched to its blocking condition as hereafter described. The load line of the load circuit is illustrated at 33, it being substantially parallel to the switching curve 31. When a DC current pulse is applied independently of the load circuit to the memory-type device as by the voltage source 17, low resistance 18 and switch 19 in FIG. 1, the load line for such current is along the line 34 since there is very little, if any, resistance in this control circuit, and as the load line 34 intersects the curve 30, the conducting condition of the device is immediately realtered and switched to its blocking condition. The memory-type device will remain in its blocking condition until switched to its conducting condition by the reapplication of a threshold voltage to the device through the terminals 15 and 16.

Figure 6:
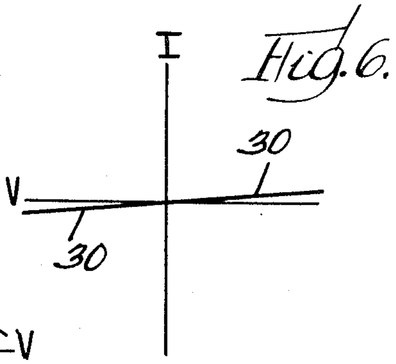
FIGS. 6 and 7 are voltage current curves illustrating the symmetrical operation of the memory type current controlling device and the operation thereof when included in an AC load circuit.
Figure 7:
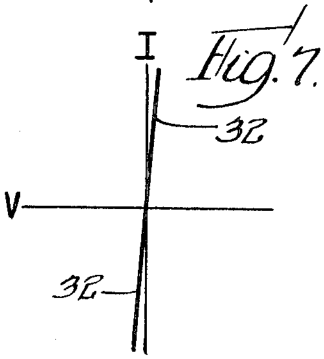

The memory-type current controlling device 10 of this invention is also symmetrical in its operation, it blocking current substantially equally in each direction and it conducting current substantially equally in each direction, and the switching between the blocking and conducting conditions being extremely rapid. In the case of AC operation, the voltage current characteristics for the second half-cycle of the AC current would be in the opposite quadrant from that illustrated in FIG. 5. The AC operation of the memory-type device is illustrated in FIGS. 6 and 7. FIG. 6 illustrates the device 10 in its blocking condition where the peak voltage of the AC voltage is below the threshold voltage value of the device, the blocking condition being illustrated by the curve 30 in both half-cycles. When, however, the peak voltage of the applied AC voltage increases above the threshold value of the memory-type device, the device substantially instantaneously switches to the conducting condition illustrated by the curve 32 and it remaining in this conducting condition regardless of the reduction of the current to zero or the reversal of the current. This symmetrical conducting condition is illustrated by the curve 32 in FIG. 7.

When the switch 19 is manipulated to apply a current pulse above a threshold current value and the voltage applied to the terminals 15 and 16 is below the threshold voltage value, the memory type current controlling device is immediately switched to its blocking condition as illustrated by the curve 30 in FIG. 6. For a given configuration of the memory-type device, the high electrical resistance may be about 1 megohm and the low electrical resistance about 10 ohms, the threshold voltage value may be about 20 volts and the switching times are extremely rapid. It has been found that by using minor amounts of $TiO_2$ in the substantially $VO_2$ extremely satisfactory memory-type current controlling devices are obtained.

The foregoing operations of the nonmemory device and the memory device are like those disclosed in the aforementioned patent and, therefore, a further description thereof is not considered necessary here.

While for purposes of illustration several forms of this invention have been disclosed, other forms thereof may become apparent to those skilled in the art upon reference to this disclosure and, therefore, this invention is to be limited only by the scope of the appended claims.

We claim:

1. A current controlling device for an electrical circuit including a semiconductor element and connecting electrodes in electrical contact therewith, said semiconductor elements having means for providing a threshold voltage value there across and a relatively high electrical resistance therein to provide a blocking condition for substantially blocking current therethrough and for substantially instantaneously decreasing said relatively high electrical resistance, in response to a voltage above said threshold voltage value, to a relatively low electrical resistance of at least two orders of magnitude lower than the relatively high electrical resistance to provide a conducting condition for substantially conducting current therethrough, the improvement wherein said semiconductor element comprises a thin substantially amorphous film of substantially $VO_2$ having electrical resistance.

2. A current controlling device as defined in claim 1 wherein the relatively low electrical resistance of the conducting condition immediately changes back to the relatively high electrical resistance in response to a decrease in current below a minimum current holding value for re-establishing the blocking condition.

3. A current controlling device as defined in claim 2 wherein the relatively high electrical resistance of the blocking condition decreases to the relatively low electrical resistance of the conducting condition during each half cycle in response to the instantaneous voltage of an AC voltage above said threshold voltage value, and wherein the relatively low electrical resistance of the conducting condition changes back to the relatively high electrical resistance of the blocking condition during each half cycle in response to the instantaneous value of an AC current below said minimum current holding value.

4. The current controlling device as defined in claim 1 wherein the relatively low electrical resistance conducting condition remains in the absence of current, and said relatively low electrical resistance of the conducting condition changes back to said relatively high electrical resistance of the blocking condition in response to a current pulse of at least threshold current value.

5. The current controlling device as defined in claim 4 wherein said substantially amorphous film of substantially $VO_2$ includes a minor amount of $Ti0_2$.

6. A current controlling device as defined in claim 1 wherein said substantially amorphous film includes a path therethrough, between the electrodes of said relatively high electrical resistance and threshold voltage value and being less than the electrical resistance and breakdown voltage value of the surrounding substantially amorphous film, said path decreasing to said relatively low electrical resistance.

7. A current controlling device as defined in claim 6 wherein the vanadium and oxygen atoms in said path between the electrodes have different bonding therebetween than in the surrounding amorphous film.

8. A current controlling device as defined in claim 6 wherein said path between the electrodes is of a more ordered crystallinelike condition than the surrounding material.